(12) United States Patent
Liang et al.

(10) Patent No.: US 10,726,237 B2
(45) Date of Patent: Jul. 28, 2020

(54) FINGERPRINT IDENTIFICATION SENSOR, METHOD FOR MANUFACTURING THE SAME AND FINGERPRINT IDENTIFICATION APPARATUS

(71) Applicant: BOE Technology Group Co., Ltd., Beijing (CN)

(72) Inventors: Zhiwei Liang, Beijing (CN); Yingwei Liu, Beijing (CN); Wenqian Luo, Beijing (CN); Qingzhao Liu, Beijing (CN); Muxin Di, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 137 days.

(21) Appl. No.: 16/104,604

(22) Filed: Aug. 17, 2018

(65) Prior Publication Data

US 2020/0042761 A1 Feb. 6, 2020

(30) Foreign Application Priority Data

Apr. 4, 2018 (CN) .......................... 2018 1 0304347

(51) Int. Cl.
| | |
|---|---|
| *G06K 9/00* | (2006.01) |
| *H01L 27/12* | (2006.01) |
| *H01L 31/0216* | (2014.01) |
| *H01L 31/105* | (2006.01) |
| *H01L 31/18* | (2006.01) |

(52) U.S. Cl.
CPC ........ *G06K 9/0004* (2013.01); *H01L 27/1218* (2013.01); *H01L 31/02164* (2013.01); *H01L 31/105* (2013.01); *H01L 31/18* (2013.01)

(58) Field of Classification Search
CPC .............. G06K 9/0004; H01L 27/1218; H01L 31/02164; H01L 31/105; H01L 31/18
See application file for complete search history.

(56) References Cited

U.S. PATENT DOCUMENTS

| | | | | |
|---|---|---|---|---|
| 6,064,091 | A * | 5/2000 | Deane ................. | H01L 27/1214 257/347 |
| 2009/0185120 | A1* | 7/2009 | Yoon .................... | G02F 1/13306 349/116 |
| 2011/0147756 | A1* | 6/2011 | Moriguchi ........ | H01L 29/78609 257/60 |
| 2013/0143350 | A1* | 6/2013 | Xu ........................... | H01L 31/18 438/73 |
| 2013/0314883 | A1* | 11/2013 | Ling ...................... | H05K 7/026 361/749 |
| 2014/0087510 | A1* | 3/2014 | Xu ..................... | H01L 27/14658 438/59 |
| 2015/0340512 | A1* | 11/2015 | Li ....................... | H01L 27/1218 257/72 |

(Continued)

*Primary Examiner* — Utpal D Shah
(74) *Attorney, Agent, or Firm* — Kinney & Lange, P.A.

(57) ABSTRACT

A fingerprint identification sensor, a method of fabricating the same, and a fingerprint identification apparatus are provided. The fingerprint identification sensor includes: a substrate; a plurality of sensor units on the substrate, each of the sensor units comprising a thin film transistor and a photosensitive device; wherein the thin film transistor comprises a source and a drain, an active layer and a gate, the source and the drain being arranged substantially in a direction perpendicular to the substrate surface.

14 Claims, 4 Drawing Sheets

(56) References Cited

U.S. PATENT DOCUMENTS

| | | | |
|---|---|---|---|
| 2016/0111483 A1* | 4/2016 | Park | H01L 27/3265 257/40 |
| 2016/0181289 A1* | 6/2016 | Long | H01L 27/1214 257/71 |
| 2017/0031218 A1* | 2/2017 | Li | G02F 1/136204 |
| 2017/0084668 A1* | 3/2017 | Wang | G06F 3/0416 |
| 2017/0372113 A1* | 12/2017 | Zhang | G02B 5/3025 |
| 2018/0068157 A1* | 3/2018 | Zeng | G06K 9/001 |
| 2018/0323243 A1* | 11/2018 | Wang | H01L 27/3234 |
| 2019/0064985 A1* | 2/2019 | Zhu | G02F 1/1343 |
| 2019/0123080 A1* | 4/2019 | Kanicki | H01L 27/14623 |
| 2019/0332842 A1* | 10/2019 | Zhou | H01L 27/3276 |

\* cited by examiner process

FINGERPRINT IDENTIFICATION SENSOR, METHOD FOR MANUFACTURING THE SAME AND FINGERPRINT IDENTIFICATION APPARATUS

CROSS-REFERENCE TO RELATED APPLICATION(S)

This application claims the benefit of Chinese Patent Application No. 201810304347.3 filed on Apr. 4, 2018 in the State Intellectual Property Office of China, the whole disclosure of which is incorporated herein by reference.

BACKGROUND

The present disclosure relates to the field of fingerprint identification technologies, and specifically to a fingerprint identification sensor, a method for making the same, and a fingerprint identification apparatus.

With a continuous development of the Internet of Things technology, fingerprint identification sensors are increasingly used in daily lives. With the development of integrated electronic technology, fingerprint identification sensors are gradually changed toward thin film, miniaturization and integration.

Therefore, it is desirable to provide a novel fingerprint identification sensor that satisfies thin film formation, a method for manufacturing the same, as well as a fingerprint identification apparatus.

SUMMARY

According to an aspect of the present disclosure, there is provided a fingerprint identification sensor, comprising: a substrate; a plurality of sensor units on the substrate, each of the sensor units comprising a thin film transistor and a photosensitive device; wherein the thin film transistor comprises a source and a drain, an active layer and a gate, the source and the drain being arranged substantially in a direction perpendicular to the substrate surface.

In an embodiment, at least a portion of the active layer is located between the source and drain in the direction perpendicular to the substrate surface.

In an embodiment, in a direction parallel to the substrate surface, the gate is located on a side of the source and the drain away from the photosensitive device, and the thin film transistor further comprises a gate insulation layer between the gate and the active layer.

In an embodiment, within each of the sensor units, in a direction parallel to the substrate surface, the thin film transistor is located on a first side of a substrate surface and the photosensitive device is located on a second side of the substrate surface opposite to the first side, the photosensitive device, the source and drain, the active layer, as well as the gate are disposed on the substrate surface sequentially from the second side to the first side.

In an embodiment, one of the source and the drain is disposed directly on the substrate surface and is directly connected to the active layer, the other of the source and drain is disposed on the gate insulation layer and is connected to the active layer through a first via hole in the gate insulation layer in the direction perpendicular to the substrate surface.

In an embodiment, a black resin layer is disposed between the source and the drain, and the active layer covers at least a portion of the black resin layer.

In an embodiment, the photosensitive device comprises a first electrode, a photosensitive layer, and a second electrode disposed in the direction perpendicular to a substrate surface, and wherein the first electrode is closer to the substrate surface than the second electrode, one of the source and the drain is integrated with the first electrode.

In an embodiment, the photosensitive device comprises a first electrode, a photosensitive layer, and a second electrode disposed in the direction perpendicular to a substrate surface, and wherein the first electrode is closer to the substrate surface than the second electrode, one of the source and the drain is integrated with the first electrode.

In an embodiment, the photosensitive device comprises a first electrode, a photosensitive layer, and a second electrode disposed in the direction perpendicular to a substrate surface, and wherein the first electrode is closer to the substrate surface than the second electrode, one of the source and the drain is integrated with the first electrode.

In an embodiment, the gate insulation layer of the thin film transistor covers at least an upper portion of the photosensitive layer and the second electrode is connected to the photosensitive layer through a second via hole in the gate insulation layer.

In an embodiment, the photosensitive device is a PIN photodiode or a heterojunction photodiode.

According to another aspect of the present disclosure, there is provided a method for manufacturing a fingerprint identification sensor according to claim 1, comprising the steps of: a) depositing a metal layer on the substrate surface and integrally forming one of the source and the drain of the thin film transistor as well as the first electrode of the photosensitive device through one and the same patterning process; b) preparing a photosensitive layer of the photosensitive device and forming an active layer of the thin film transistor; c) depositing a metal layer and performing a patterning process to the metal layer to form a second electrode of the photosensitive device, a gate of the thin film transistor, and the other of the source and the drain, respectively.

In an embodiment, the method further comprises a step between step a) and step b): applying a black resin material and performing a patterning process to the black resin material to form a black resin layer.

In an embodiment, the method further comprises a step between step b) and step c): depositing an insulation layer and performing a patterning process to the insulation layer to form a gate insulation layer.

In an embodiment, the other of the source and the drain is connected to the active layer through a first via hole in the gate insulation layer, and the second electrode is connected to the photosensitive layer of the photosensitive device through a second via hole of the gate insulation layer.

In an embodiment, the photosensitive device is a PIN photodiode, and the step b) comprises: preparing an N-terminal, a P-terminal, and an intrinsic portion between the N-terminal and the P-terminal of the PIN photodiode, and forming the active layer of the thin film transistor at the same time of forming one of the N-terminal, the P-terminal, and the intrinsic portion of the PIN photodiode.

In an embodiment, the photosensitive device is a heterojunction photodiode, the step b) comprises: preparing an N-terminal and a P-terminal of the heterojunction photodiode, and forming the active layer of the thin film transistor at the same time of forming the N-terminal of the heterojunction photodiode.

According yet another aspect of the present disclosure, there is provided a fingerprint identification apparatus comprising the fingerprint identification sensor mentioned above.

BRIEF DESCRIPTION OF THE DRAWINGS

In order to more clearly illustrate the technical solutions of the embodiments of the present disclosure, the drawings of the embodiments will be briefly described below, and it should be appreciated that the drawings described below refer only to some embodiments of the present disclosure, instead of limiting the present disclosure.

DETAILED DESCRIPTION

In order to more clearly illustrate the objects, technical solutions and advantages of the present disclosure, the embodiments of the present disclosure will be described in detail below with reference to the accompanying drawings. It is to be appreciated that the following description of the embodiments is intended to illustrate and explain the general concepts of the present disclosure, instead of limiting the disclosure. In the specification and the drawings, same or similar reference signs are used to refer to same or similar components or components. For the sake of clarity, the figures are not necessarily drawn to scale, and some of the common components and structures may be omitted in the figures.

Unless otherwise defined, technical terms or scientific terms used in the present disclosure are intended to be understood in the ordinary meaning of those skilled in the art. The "first," "second," and similar terms used in the present disclosure do not denote any order, quantity, or importance, but are used to distinguish different components. The wording "a" or "an" does not exclude a plurality. The wording "include" or "comprises" and the like are intended to mean that the elements or items that precedes the wording include the element(s) or the item(s) that is(are) listed after the wording and its(their) equivalent, and do not exclude other element or item. "Connected to" or "connected with" and the like are not limited to physical or mechanical connections, but may include electrical connections, regardless directly or indirectly. "Upper", "lower", "left", "right", "top" or "bottom" and the like are only used to indicate a relative positional relationship. When the absolute position of an object to be described is changed, the relative positional relationship thereof may also be changed correspondingly. When an element such as a layer, a film, a region or a substrate is referred to as being "on" or "under" another element, the element may be "on" or "under" another element "directly", or there may be an intermediate component.

In the fingerprint identification process of the finger, since the lines created by the unevenness of the skin forms various patterns, and the patterns of the lines are unique. Such uniqueness may be used to associate a person with his fingerprint. By comparing with a pre-saved fingerprint, his true identity may be verified.

Figure 1:
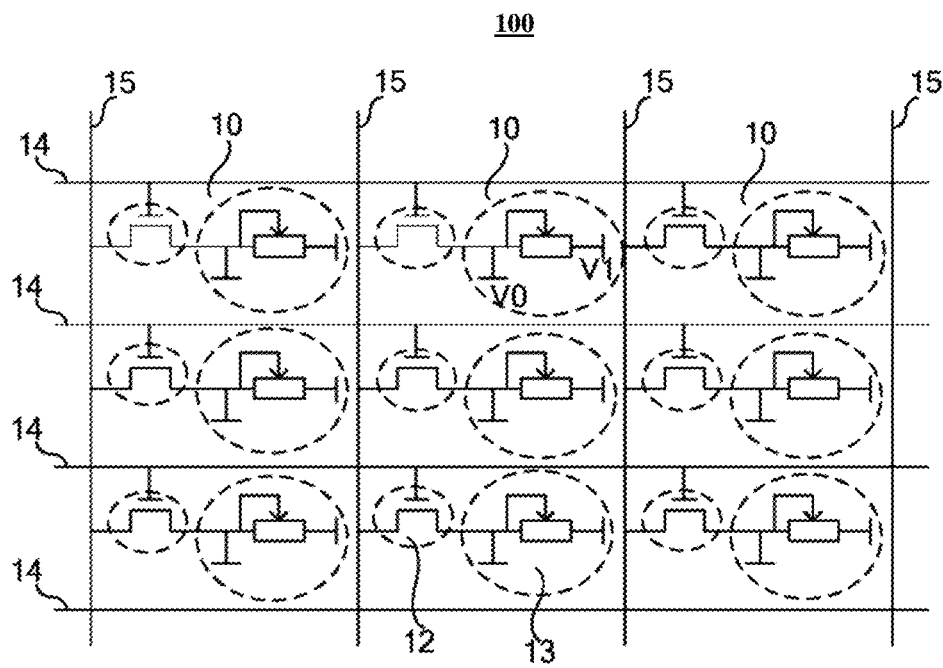
FIG. 1 illustrates a circuit principle schematic view of a fingerprint identification sensor according to an embodiment of the present disclosure.

FIG. 1 illustrates a circuit principle schematic view of a fingerprint identification sensor according to an embodiment of the present disclosure. As shown in FIG. 1, the fingerprint identification sensor 100 includes a plurality of sensor units 10 located on a substrate and arranged in a predetermined manner (e.g., arranged in an array). Each of the plurality of sensor units 10 includes a transistor 12 and a photosensitive device 13. In one example, the transistor 12 is a transistor having a relatively small thickness, such as a thin film transistor, which is adapted to the requirements for thin filming trends.

Figure 2:
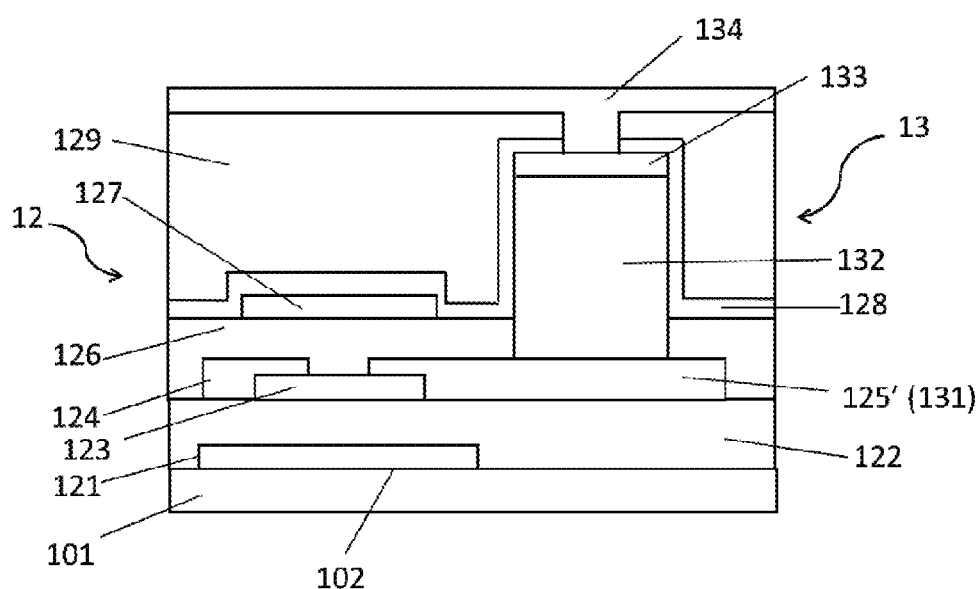
FIG. 2 illustrates a structural schematic view of the finger identification sensor shown in FIG. 1.

FIG. 2 illustrates a structural schematic view of the finger identification sensor shown in FIG. 1. The thin film transistor 12 and the photosensitive device 13 are respectively located on a substrate surface 102 of the substrate 101.

The photosensitive device 13 includes a first electrode 131 made of a metal conductive material, a second electrode 133 made of a transparent conductive material, and a photosensitive layer 132 between the first electrode 131 and the second electrode 133. In one example, the first electrode 131 and the second electrode 133 are both in contact with the photoactive layer 132. It should be noted that the present disclosure does not limit the material of the photosensitive layer 132, and those skilled in the art may select it as needed.

Specifically, the thin film transistor 12 includes a gate electrode 121, a gate insulation layer 122, a semiconductor active layer 123, a source 124, and a drain 125'. The gate electrode 121 is connected to a gate scanning line 14, the source 124 is connected to a signal reading line 15, and the drain 125' is in contact with the photosensitive layer 132.

As shown in FIG. 2, the drain 125' of the thin film transistor 12 is integrated with one electrode (e.g., the first electrode 131) of the photosensitive device 13, that is, the integrated drain 125' shown in FIG. 2. As shown in FIG. 2, a left end of the integrated drain 125' serves as the drain of the thin film transistor 12, and a right end of the integrated drain 125' serves as the first electrode 131 of the photosensitive device 13. Therefore, in order to show the first electrode 131 in FIG. 2, the reference sign 131 is presented in the parentheses following the reference sign of the integrated drain 125'. Through such an integration process, times of using the mask may be reduced and the fabrication process may be simplified.

A first buffer layer or passivation layer 126 is located on patterns of the source 124 and the drain 125', and a light shielding layer 127 is disposed at a region of the first buffer layer planarization layer 126 corresponding to the active layer 123. In some embodiments, another light shielding layer may also be disposed between the photosensitive layer 132 and the first electrode 131.

Since the light shielding layer 127 is made of an opaque material, it may be ensured by providing the light shielding layer 127 at a position corresponding to the active layer 123 and/or the photosensitive layer 132 (if a light shielding layer is provided) that: the light shielding layer 127 may be used to shield any external light source, thereby preventing a change in the resistance of the active layer 123 and/or the photosensitive layer 132 caused by the external light source.

A photosensitive layer (i.e., PIN portion) 132 of an optoelectronic device is disposed at a position corresponding to the drain 125' (e.g., the right end of the drain 125') and in a via hole of the pattern of the first buffer layer 126. A second electrode (for example, an ITO electrode) 133 is disposed on the photosensitive layer 132. Thereafter, a second buffer layer 128, a planarization layer 129, and an ITO electrode 134 are provided on the patterns of the light shielding layer 127 and the second electrode 133.

As shown in FIG. 1-2, the thin film transistor 12 is shown as a bottom gate type transistor, that is, the gate electrode 121, the gate insulation layer 122, the semiconductor active layer 123, the source 124, and the drain 125' are sequentially disposed on the substrate 101 from the bottom to the top as a single layer in a direction perpendicular to the substrate surface 102 of the substrate 101. Of course, the thin film transistor 12 may also be a top gate type transistor. Here, regardless of the bottom gate type or top gate type thin film transistor 12, a thin film transistor having an arrangement among a gate electrode, a semiconductor active layer and a source/drain as shown in FIGS. 1-2 may be referred to as a plane type thin film transistor.

Figure 3:
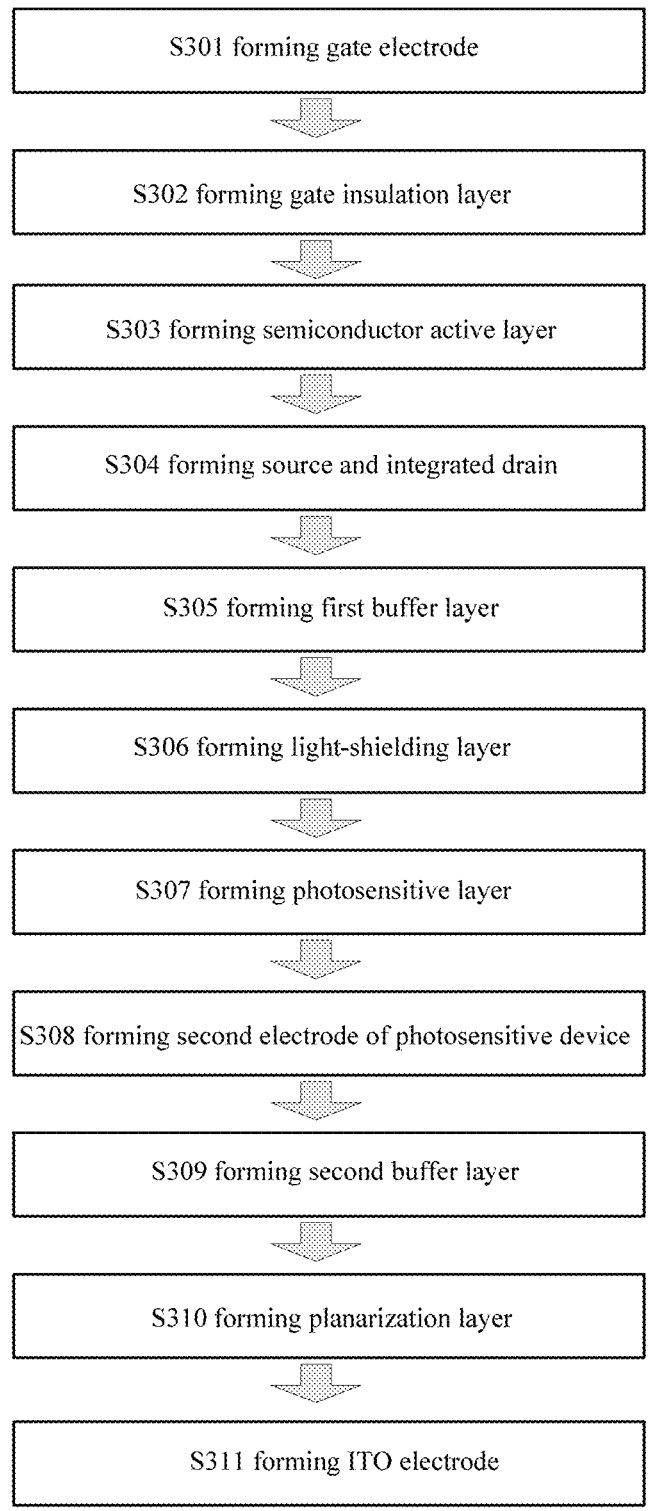
FIG. 3 illustrates a flow chart of the manufacturing steps of the fingerprint identification sensor of FIG. 2.

FIG. 3 illustrates a flow chart of the manufacturing steps of the fingerprint identification sensor of FIG. 2. Firstly, as shown in step S301, a metal material layer is deposited on the substrate 101, for example by a magnetron sputtering, and is processed by a patterning process so as to form the gate electrode 121.

As shown in step S302, on the basis of the structure prepared in step S301, an insulation layer is deposited on the gate electrode 121, for example by a PECVD process, and is processed by a patterning process so as to form a gate insulation layer 122. The gate insulation layer 122 may be a single layer of SiNx or SiO2, or a laminate thereof.

As shown in step S303, on the basis of the structure prepared in step S302, the semiconductor active layer 123 is formed on the gate insulation layer 122 with a photolithography process.

As shown in step 304, on the basis of the structure prepared in step S303, a metal material layer is deposited on the semiconductor active layer 123, for example by magnetron sputtering, and is processed by a patterning process so as to form the source 124 and the integrated drain 125'. The drain 125' here is an integrated drain, that is, the drain of the thin film transistor 12 is integrated with the first electrode 131 of the photosensitive device 13.

As shown in step S305, on the basis of the structure prepared in step S304, an insulation layer is deposited on the source 124 and the drain 125' with a PECVD method and is processed by a patterning process so as to form the first buffer layer 126.

As shown in step 306, on the basis of the structure prepared in step S305, a layer of light-shielding material is deposited on a first buffer layer 126, for example by PECVD, and is processed by a patterning process so as to form a light-shielding layer 127 which is located in a region above the active layer 123.

As shown in step 307, the photosensitive layer 132 of the photosensitive device 13 (i.e., a P terminal, a N terminal of the PIN photodiode, and an intrinsic portion therebetween) is prepared on the right end region of the drain 125'.

As shown in step 308, on the basis of the structure prepared in step S307, a metal layer (for example, an ITO transparent electrode layer) is deposited on the photosensitive layer 132 with magnetron sputtering and is processed by a patterning process so as to form the second electrode 133 of the photosensitive device 13.

As shown in step 309, on the basis of the structure prepared in step S308, an insulation layer is deposited on the second electrode 133 as a second buffer layer 128.

As shown in step 310, on the basis of the structure prepared in step S309, an insulation layer material is deposited on the second buffer layer 128 and is processed by a patterning process with a photolithography process so as to form the planarization layer 129.

As shown in step 311, on the basis of the structure prepared in step S310, a metal layer (for example, an ITO transparent electrode layer) is deposited on the planarization layer 129, for example by magnetron sputtering, and is processed by a patterning process so as to form the ITO electrode (for example, a common electrode) 134 for connecting to an external driving circuit.

As shown in FIG. 3, about 11 steps and 11 mask processes are used in the preparation step of the fingerprint identification sensor 100, and the thin film transistor 12 is arranged in a planar structure, occupying a relatively large area in each of the sensor units 10. In the case where higher identification efficiency and a thinner structure are required, the structural arrangement shown in FIGS. 2-3 does not satisfy this requirement.

As discussed hereinafter, an embodiment of a fingerprint identification sensor including a thin film transistor having a vertical type structural arrangement, which is illustrated in FIGS. 4-7, will be referred to. Here, the thin-film transistor having the vertical type arrangement, or a vertical-type thin film transistor, means that the source and the drain, the active layer, and the gate in the thin film transistor are arranged sequentially on the substrate from a side away from or close to the side of the photosensitive device in a direction parallel to the substrate surface.

In an embodiment of the present disclosure, a fingerprint identification sensor includes a substrate and a plurality of sensor units on the substrate, each of the sensor units including a thin film transistor and a photosensitive device. The thin film transistor includes a source and a drain, an active layer, and a gate. The source and drain are arranged in a direction perpendicular to the substrate surface. The gate is located on a side of the source and the drain away from the photosensitive device, and a gate insulation layer is located between the gate and the active layer. At least a portion of the active layer is located between the source and the drain in the direction perpendicular to the substrate surface.

The provision that at least a portion of the active layer is located between the source and the drain in the direction perpendicular to the substrate surface means that, a portion of the active layer may be located directly in a facing region between the source and the drain in the direction perpendicular to the substrate surface, or alternatively it may also be located in a region outside the facing region between the source and the drain, for example, a region adjacent to the facing region.

One of the source and the drain is disposed directly on the substrate surface and is directly connected to the active layer. In the direction perpendicular to the substrate surface, the other of the source and the drain is disposed on the gate insulation layer and is connected to the active layer through a first via hole in the gate insulation layer.

In one example, a black resin layer is disposed between the source and the drain, and the active layer covers at least a portion of the black resin layer.

In one example, the photosensitive device includes a first electrode, a photosensitive layer, and a second electrode disposed sequentially in the direction perpendicular to the substrate surface. The first electrode is closer to the substrate surface than the second electrode, and one of the source and the drain is formed integrally with the first electrode.

A method for manufacturing the above-described fingerprint identification sensor is also provided in an embodiment of the present disclosure. The method includes the following steps. A metal layer is firstly deposited on the substrate surface, and one of the source and drain of the thin film transistor and the first electrode of the photosensitive device are integrally formed in one and the same patterning process. Thereafter, a black resin material is sequentially applied and a patterning process is performed thereon to form a black resin layer, and a photosensitive layer of the photosensitive device is prepared and an active layer of the thin film transistor is formed. Then, an insulation layer is deposited and a patterning process is performed thereon to form a gate insulation layer. A metal layer is finally deposited and a patterning process is performed thereon to form a second electrode of the photosensitive device, a gate of the thin film transistor, as well as the other of the source and drain, respectively.

The fingerprint identification sensor and the corresponding manufacturing method provided by the present disclosure will be described below with reference to FIGS. 4-5 and 6-7, respectively.

Figure 4:
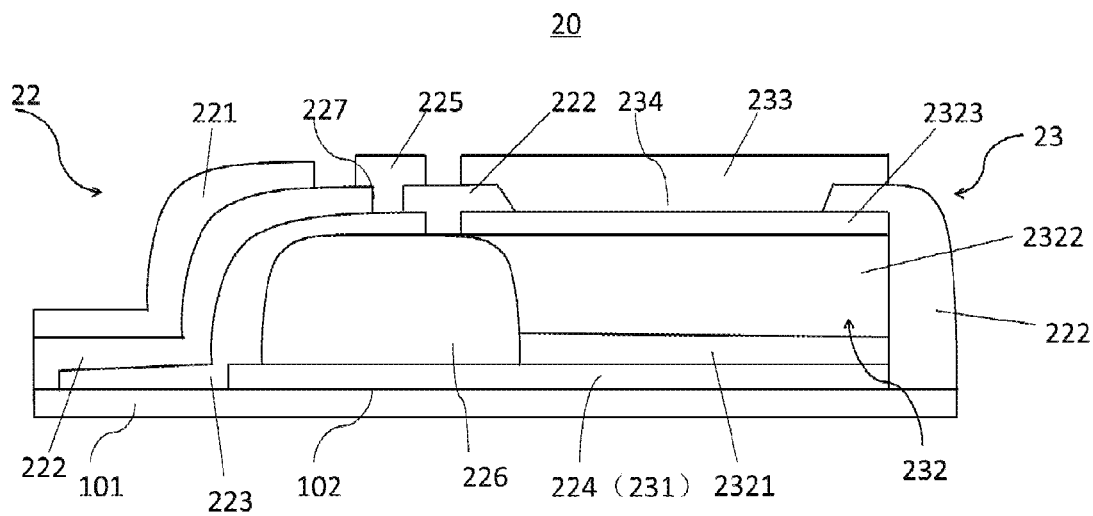
FIG. 4 illustrates a structural schematic view of a fingerprint identification sensor according to another embodiment of the present disclosure.

FIG. 4 illustrates a structural schematic view of a fingerprint identification sensor according to another embodiment of the present disclosure. The fingerprint identification sensor includes a substrate 101 and a plurality of sensor units 20 disposed on the substrate 101. The plurality of sensor units 20 are arranged in a predetermined manner on the substrate surface 102, for example in a matrix form. Only one sensor unit 20 is shown in FIG. 4. It will be apparent that each of the sensor units in the fingerprint identification sensor may include a thin film transistor 22 and a photosensitive device 23 as shown. The photosensitive device 23 comprises a PIN photodiode.

As described above, the main difference between the fingerprint identification sensor of the present embodiment and the fingerprint identification sensor 100 shown in FIGS. 2-3 lies in that the structure of the thin film transistor 22 in the sensor unit is arranged in a vertical type rather than a planar type.

In FIG. 4, the thin film transistor 22 includes a source 224 and a drain 225, an active layer 223, and a gate 221. The source 224 and the drain 225 are arranged in a direction perpendicular to the substrate surface 102, and at least a portion of the active layer 223 is located between the source 224 and the drain 225 in a direction perpendicular to the substrate surface 102. It is illustrated in FIG. 4 that a rightmost portion of the active layer 223 is positioned directly in a facing region between the source 224 and the drain 225. Of course, it can be understood that the active layer 223 may also be disposed such that any portion thereof is located between the source 224 and the drain 225, but no portion thereof is located in the facing region.

One of the source 224 and the drain 225 is integrated with one electrode of the photosensitive device 23. Specifically, it is illustrated in FIG. 4 that the source 224 is integrated with the first electrode (i.e., the lower electrode) 231 of the photosensitive device 23.

Referring to FIG. 4, a thin film transistor 22 is disposed on the left side and a photosensitive device 23 is disposed on the right side of the surface 102 of the substrate 101. The direction parallel to the surface 102 of the substrate 101 is the direction from left to right or from right to left in FIG. 4. On the surface 102 of the substrate 101, the source 224 and the drain 225, the active layer 223, and the gate 221 are disposed in sequence from the left side of the photosensitive device 23, that is, in a vertical type arrangement described in the present disclosure.

In one example, the source 224 is disposed as an integrated source and is located directly on substrate surface 102. The meaning of the integrated source here is that the source is formed on the substrate surface 102 with one and the same patterning process or is formed integrally thereon, and the left portion of the source 224 serves as the source of the thin film transistor 22, and the right portion serves as one electrode 231 of the photosensitive device 23. In such an arrangement, since the electrodes and sources of the photosensitive device may be prepared using a single mask and photolithography process, times of using the mask may be reduced or the fabrication process may be simplified. Of course, it is also possible to employ a manner of separately arranging the source or the electrodes of the photosensitive device and electrically connecting them as needed.

A black resin layer 226 is also disposed on the source 224. The black resin layer 226 may electrically insulate the source 224 from the gate 221 or the drain 225, and may also function to block light from the photosensitive device 23 on the right side, preventing light from adversely affecting the active layer 223 of the thin film transistor 22. In addition, by providing the black resin layer 226, it is also possible to raise the active layer 223 which is subsequently disposed on the black resin layer 226, facilitating a vertical arrangement of the thin film transistor 22.

In some embodiments, an insulation layer, rather than the black resin layer 226 described above, is also disposed on the source 224 alternatively. The insulation layer may electrically insulate the source 224 from the gate 221 or the drain 225.

The active layer 223 is made of an a-Si:H material and covers at least a portion of the black resin layer 226. One end of the active layer 223 is connected to the drain 225 over the black resin layer 226 through a first via hole 227 in the gate insulation layer 222. The other end of the active layer 223 extends over the black resin layer 226 to the substrate surface 102 of the substrate 101 and is connected to the left end of the source 224.

The gate insulation layer 222 covers the entire active layer 223, and the left end of the gate insulation layer 222 extends to the surface 102 and covers the left end of the active layer 223. The right end of the gate insulation layer 222 extends beyond the first via hole 227 and overlies the photosensitive device 23.

The drain 225 is located above the first via hole 227 and is connected to the active layer 223 through the first via hole 227, specifically to the right end of the active layer 223.

The gate electrode 221 covers a portion of the gate insulation layer 222 and is electrically insulated from the drain 225 by an insulation layer.

As shown in FIG. 4, the drain 225 is disposed at a position above the source 224 in a direction perpendicular to the surface 102 of the substrate 101 (i.e., the up and down direction in FIG. 4), that is, an orthographic projection of the drain 225 on the surface 102 falls within a range of the orthographic projection of source 224 on surface 102.

In some embodiments, source 224 and drain 225 may be arranged such that the line between them is at an angle (such as 60° and the like) with respect to a direction perpendicular to substrate surface 102.

Further, the photosensitive device 23 includes a first electrode 231 and a second electrode 233 which are respectively disposed on the photosensitive layer 232 and connected to the photosensitive layer 232 in the direction perpendicular to the substrate surface. The first electrode 231 is disposed to be closer to the surface 102 of the substrate 101 than the second electrode 233. In the present embodiment, the photosensitive device 23 is a PIN photodiode. A P terminal of the PIN photodiode is boron-doped intrinsic a-Si, i.e. P+ a-Si; a N-terminal of the PIN photodiode is phosphorus-doped intrinsic a-Si, i.e. n+ a-Si; and the intrinsic part in the middle is the intrinsic a-Si.

In one example, the right end of the source 224 serves as the first electrode, and for ease of description and illustration, the reference sign of the first electrode 231 is shown in parentheses following the reference sign of the source 224. In a variant, the first electrode 231 and the source 224 may be arranged as two individual electrodes and they may be electrically connected to each other.

In the present disclosure, it should be noted that the source 224 and the drain 225 may be interchangeable, that is, the drain 225 may be directly disposed on the surface 102 and a portion thereof may be used as the first electrode 231.

In some embodiments, since the fingerprint identification sensor provided by the present disclosure employs a thin film transistor having a vertical structural arrangement, it may be allowed to increase the area occupied by the photosensitive device structure within each of the sensor units; for example, compared with the structure shown in FIG. 3, the area occupied by the structure of the photosensitive device within each of the sensor units is increased, thereby improving the identification efficiency of the fingerprint identification sensor.

Figure 5:
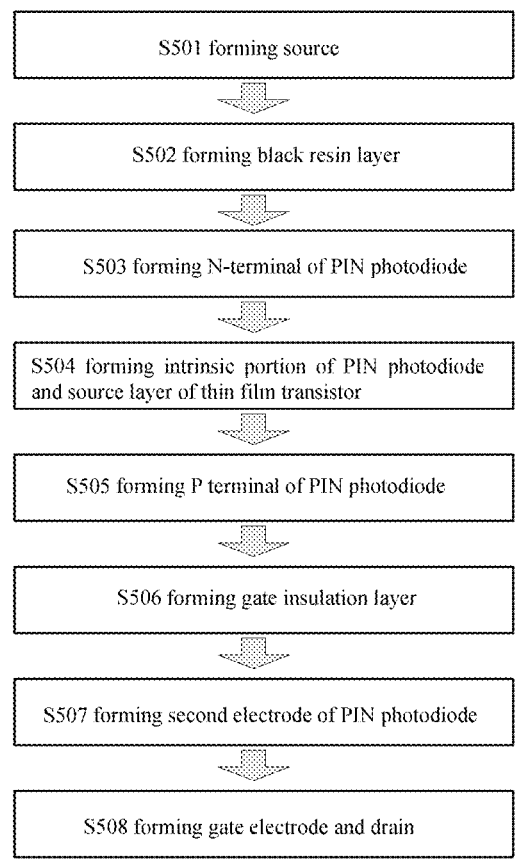
FIG. 5 illustrates a flow chart of manufacturing the fingerprint identification sensor shown in FIG. 4.

FIG. 5 illustrates a flow chart of manufacturing the fingerprint identification sensor shown in FIG. 4. As shown in FIG. 5, the method of preparing the fingerprint identification sensor 20 includes the following steps.

Specifically, as shown in step 501, a layer of metal material is deposited on the substrate 101 and is processed by a patterning process so as to form the source 224. Here, since a portion of the source 224 is used as an electrode of the photosensitive device 23, it is shown in FIG. 4 that the source 224 has a relatively long length and that the right side portion of the source 224 is disposed directly under the photosensitive device 23.

As shown in step 502, on the basis of the structure prepared in step S501, a black resin material is applied and is processed by a patterning process so as to form a black resin layer 226. The black resin layer 226 may has a light shielding function, that is, to prevent the light from the photosensitive device 23 on the right side from adversely affecting the active layer 223 of the thin film transistor 22. In addition, by providing the black resin layer 226, it is also possible to raise the active layer 223 which is subsequently disposed on the black resin layer 226, facilitating a vertically disposed thin film transistor 22.

As shown in step 503, on the basis of the structure prepared in step S502, n+ a-Si is deposited with a process like PECVD and a patterning process is performed thereon to form the N-terminal 2321 of the PIN photodiode 232, respectively.

As shown in step 504, on the basis of the structure prepared in step S503, intrinsic a-Si is deposited with a process such as PECVD and a patterning process is performed thereon to simultaneously form an intrinsic portion 2322 of the PIN photodiode 232 and the source layer 223 of the thin film transistor 22. It should be understood that the active layer 223 may be prepared while preparing any one of the N-terminal, the P-terminal, and the a-Si layer in the intrinsic portion of the photosensitive layer 132 of the PIN photodiode, and those skilled in the art may make the selection according to actual needs, without being necessarily limited to the case shown in FIG. 5.

As shown in step 505, on the basis of the structure prepared in step S504, a doping process is used to dope a certain amount of phosphorus element on an uppermost layer of the intrinsic portion 2322 (a-Si), so that this portion of the intrinsic portion 2322 (a-Si) becomes the P terminal 2323 (p+a-Si) of the PIN photodiode 232, and finally a photosensitive layer (i.e., PIN photodiode) 232 is formed integrally in the direction perpendicular to the substrate surface.

As shown in step S506, on the basis of the structure prepared in step S505, an insulation layer is deposited on the photosensitive layer 232 and the active layer 223 with a process like PECVD and a patterning process is performed thereon so as to form a gate insulation layer 222. The pole insulation layer 222 may be a single layer of SiNx or SiO2, or a laminate thereof.

As shown in step S507, on the basis of the structure prepared in step S506, a metal layer is formed on the gate insulation layer 222, for example by magnetron sputtering, and is processed by a patterning process so as to form a second electrode 233 (for example, an ITO electrode). The second electrode 233 is connected to the P terminal 2323 of the PIN photodiode through a second via hole 234.

As shown in step S508, on the basis of the structure prepared in step S507, a metal layer is formed, for example by magnetron sputtering, and is processed by a patterning process so as to form the gate electrode 221 and the drain 225. Since the gate electrode 221 is made of an opaque metal material and surrounds most of region above the active layer 223 (for example, the upper left portion and the upper and middle portion shown in FIG. 4), thus the gate electrode 221 may also serve to shield light for the source layer 223.

In the method for manufacturing the fingerprint identification sensor provided in this embodiment, by employing the vertical arrangement of the thin film transistors, times of using the mask is significantly reduced as compared with the process shown in FIG. 3.

In some embodiments, during the preparation of the fingerprint sensor of the present disclosure, it is also possible to further reduce times of using the mask, by combining one or two of the steps of forming the active layer when preparing the intrinsic portion of the PIN photodiode, and disposing integrally the source or the drain with the first electrode of the PIN photodiode, with the vertical arrangement of the thin film transistors.

Figure 6:
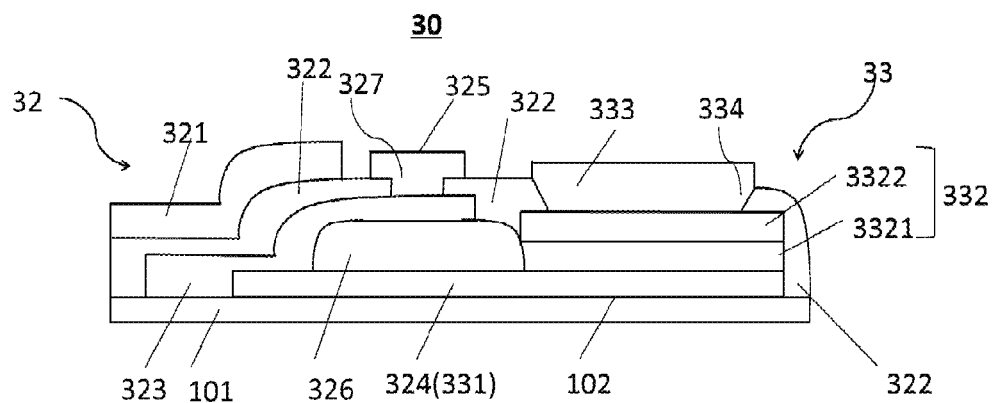
FIG. 6 illustrates a structural schematic view of a fingerprint identification sensor according to yet another embodiment of the present disclosure.

FIG. 6 illustrates a structural schematic view of a fingerprint identification sensor according to yet another embodiment of the present disclosure. The fingerprint identification sensor includes a substrate 101 and a plurality of sensor units 30 on the substrate 101. The plurality of sensor units 30 are arranged, for example, in an array. Only one sensor unit 30 is shown in FIG. 6. It will be apparent that each of the sensor units in the fingerprint identification sensor may include a thin film transistor 32 and a photosensitive device 33 mating to each other. The photosensitive device 33 comprises a heterojunction photodiode, for example made of indium gallium zinc oxide (IGZO) material.

As described above, the main difference between the fingerprint identification sensor of the present embodiment and the fingerprint identification sensor shown in FIGS. 4-5 lies in that the photosensitive device in the sensor unit is no longer a PIN photodiode, but a heterojunction photodiode.

In FIG. 6, a thin film transistor 32 is disposed on the left side and a photosensitive device 33 is disposed on the right side of the substrate surface 102 of the substrate 101. The direction parallel to the substrate surface 102 is the direction from left to right or from right to left in FIG. 6. A source 324 and a drain 325, an active layer 323, and a gate 321 are disposed on the substrate surface 102 of the substrate 101 sequentially from the left side of the photosensitive device 33, that is, in the vertical arrangement described in the present disclosure.

In one example, the source 324 is disposed as an integrated source and is disposed directly on substrate surface 102. The integrated source here means that the source is integrally formed on the substrate surface 102, and the left end of the source 324 serves as the source of the thin film transistor 32, and the right end serves as one electrode 331 of the photosensitive device 33. In such an arrangement, since one electrode of the photosensitive device and source may be prepared with a single mask and photolithography process, times of using the mask may be reduced or the fabrication process may be simplified. Of course, it is also possible to adopt a manner in which the source or the one electrode is individually provided, respectively, and electrically connected to each other as needed.

A black resin layer 326 is also disposed on the source 324. The black resin layer 326 may electrically insulate the source 324 from the gate 321 or the drain 325, and may also function to block light from the photosensitive device 33 on the right side, preventing light from adversely affecting the active layer 323 of the thin film transistor 32. In addition, by providing the black resin layer 326, it is also possible to raise the active layer 323 which is subsequently disposed on the black resin layer 326, facilitating a vertical arrangement of the thin film transistor 32. In some embodiments, an insulation layer is also alternatively disposed on the source 324, rather than the black resin layer 326 described above. The insulation layer may electrically insulate the source 324 from the gate 321 or the drain 325.

An active layer 323 of for example an IGZO material is overlaid on at least a portion of the black resin layer 326. One end of the active layer 323 and the drain 325 over the black resin layer 326 are connected through a first via hole 327 in the gate insulation layer 322. The other end of the active layer 323 extends over the black resin layer 326 to the surface 102 of the substrate 101 and is connected to the left end of the source 324.

The gate insulation layer 322 covers the entire active layer 323, and the left end of the gate insulation layer 322 extends onto the surface 102 and covers the left end of the active layer 323. The right end of the gate insulation layer 322 extends beyond the first via hole 327 and overlies the photosensitive layer of the photosensitive device 33.

The drain 325 is located on the first via hole 327 and is connected to the active layer 323 through the first via hole 327, specifically connected to the right end of the active layer 323.

The gate electrode 321 covers a portion of the gate insulation layer 322 and is electrically insulated from the drain 325 through an insulation layer.

As shown in FIG. 6, the drain 325 is disposed at a position above the source 324 in a direction perpendicular to the surface 102 of the substrate 101 (i.e., the up and down direction in the page of FIG. 6), that is, the orthographic projection of drain 325 on the surface 102 falls within the range of orthographic projections of source 324 on the surface 102. Alternatively, the source 324 and the drain 325 may also be arranged such that the line between them is at an angle (such as an angle of 30-60 degrees) with respect to the direction perpendicular to the substrate surface 102 of the substrate.

Further, the photosensitive member 33 includes a first electrode 331 and a second electrode 333 which are respectively disposed on the photosensitive layer 332 and connected to the photosensitive layer 332 in a direction perpendicular to the substrate surface. The first electrode 331 is disposed to be closer to the substrate surface 102 of the substrate 101 than the second electrode 333. In the present embodiment, the photosensitive device 33 is a heterojunction photodiode. In some embodiments, the heterojunction photodiode is comprised of an N-type IGZO material (i.e., N-terminal) 3322 and a P-type Si semiconductor material (i.e., P-terminal) 3321.

In one example, the right end of source 324 serves as the first electrode, and for ease of description and illustration purposes, the reference sign of first electrode 331 is shown in parentheses following the reference sign of source 324. In a variant, the first electrode 331 and the source 324 may be arranged as two individual electrodes and electrically connected to each other.

In the present disclosure, it should be noted that the source 324 and the drain 325 may be interchanged, that is, the drain 325 may also be disposed directly on the surface 102 and a portion thereof may be used as the first electrode.

Figure 7:
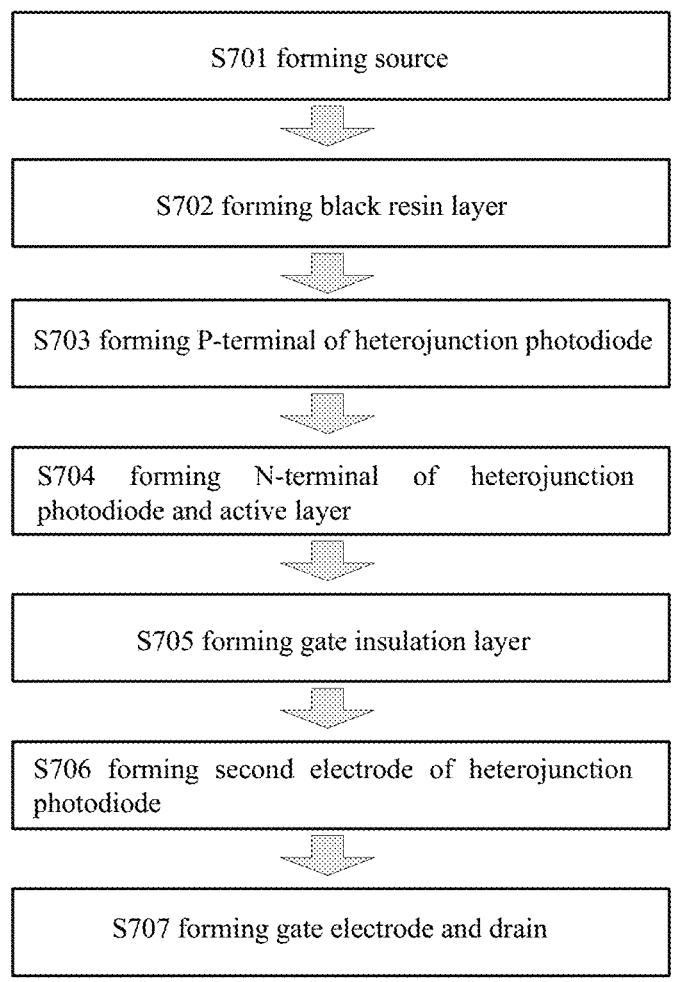
FIG. 7 illustrates a flow chart of manufacturing the fingerprint identification sensor shown in FIG. 6.

In some embodiments, since the fingerprint identification sensor provided by the present disclosure employs a thin film transistor having a vertical type of structural arrangement, it may be allowed to increase the area occupied by the photosensitive device structure within each of the sensor units; for example, compared with those shown in FIG. 3, the structure increases the area occupied by the photosensitive device structure within each of the sensor units, thereby improving the identification efficiency of the fingerprint identification sensor. FIG. 7 illustrates a flow chart of manufacturing the fingerprint identification sensor shown in FIG. 6. As shown in FIG. 7, the method for manufacturing the fingerprint identification sensor 30 includes the following steps.

Specifically, as shown in step 71, a layer of metallic material is deposited on the substrate 101 and is processed by a patterning process so as to form the source 324. Here since a portion of the source 324 is used as one of the electrodes of the photosensitive device 33 (e.g., the first electrode 331), the source 324 is shown in FIG. 6 to have a relatively long length and the right side portion of the source 324 is disposed directly under the photosensitive device 33.

As shown in step 702, on the basis of the structure prepared in step 5701, a black resin material is applied on the source 324 and is processed by a patterning process so as to form a black resin layer 326. The black resin layer 326 have a function of a light blocking, that is, to prevent the light from the photosensitive device 33 on the right side from adversely affecting the active layer 323 of the thin film transistor 32. In addition, by providing the black resin layer 326, it is also possible to raise the active layer 323 which is subsequently disposed on the black resin layer 326, facilitating a vertical arrangement of the thin film transistor 32.

As shown in step 703, on the basis of the structure prepared in step S702, the P+ a-Si is deposited with a process like PECVD and a patterning process is performed thereon to form the P terminal 3321 of the heterojunction photodiode 332.

As shown in step S704, on the basis of the structure prepared in step S703, an IGZO material layer is prepared, for example by magnetron sputtering, and is processed by a patterning process so as to simultaneously form the N-terminal 3322 of the heterojunction photodiode 332 (i.e., N-type IGZO) and an active layer 323 of the thin film transistor 32.

As shown in step S705, on the basis of the structure prepared in step S704, an insulation layer is deposited, for example by using a PECVD process, and is processed by a patterning process so as to form a gate insulation layer 322, which may be a single layer of SiNx or SiO2, or a laminate thereof.

As shown in step S706, on the basis of the structure prepared in step S705, a metal layer is formed on the gate insulation layer 322, for example by magnetron sputtering, and is processed by a patterning process so as to form a second electrode 333 (for example, an ITO electrode). The second electrode 333 is connected to the N terminal of the heterojunction photodiode 332 through the second via hole 334.

As shown in step S707, on the basis of the structure prepared in step S706, a metal layer is formed, for example by magnetron sputtering and is processed by a patterning process so as to form a gate electrode 321 and a drain 325. Since the gate electrode 321 is made of an opaque metal material and surrounds most of the region over the active layer 323 (for example, the upper left portion and the upper and middle portion shown in FIG. 6), the gate electrode 321 may also function to shield the light for the active layer 323.

In the method for manufacturing the fingerprint identification sensor provided in this embodiment, by employing the vertical arrangement of the thin film transistors, times of using the mask is significantly reduced as compared with the process shown in FIG. 3.

In some embodiments, during the preparation of the fingerprint sensor of the present disclosure, it is also possible to further reduce times of using the mask, by combining one or two of the steps of forming the active layer when preparing the intrinsic portion of the PIN photodiode, and disposing integrally the source or the drain with the first electrode of the PIN photodiode, with the vertical arrangement of the thin film transistors.

It should be noted that the steps shown in FIG. 7 and FIG. 5 are not necessarily implemented as shown in the drawings, the order of implementation of the respective steps may be appropriately adjusted as needed. For example, the order of steps S702 and S703 may be changed, that is, the P-terminal 3321 of the heterojunction photodiode 332 may be prepared at first and then the black resin layer 326 may be prepared.

Embodiments of the present disclosure also provide a fingerprint identification apparatus including the above-described fingerprint identification sensor. Of course, the fingerprint identification apparatus includes other necessary components in addition to the above-described fingerprint identification sensor, such as a signal receiving component connected to the above-described signal reading line, and the signal receiving component is configured to receive the read the fingerprint information output by signal reading line to identify fingerprint information according to the fingerprint signal.

In an embodiment of the present disclosure, since the thin film transistor adopts a vertical type structure arrangement, the fingerprint identification sensor of the present disclosure (i.e., a combination of a vertical type TFT and a PIN diode or a combination of a vertical type TFT and a heterojunction phototube) may achieve the function of optical fingerprint identification.

In the fingerprint identification sensor and the method for manufacturing the same which are provided by the present disclosure, since the thin film transistor employs a vertical structural arrangement, not only times of using the mask are reduced but also the manufacturing process may be simplified.

In the fingerprint identification sensor provided by some embodiments of the present disclosure, in the case where the thin film transistors employs a vertical structural arrangement, the area occupied by the photosensitive devices in each of the sensor units can be set to be smaller than the area occupied by the photosensitive devices in each of the sensor units of the conventional fingerprint identification sensor according to actual needs, and the identification efficiency is improved.

It should be noted that in order to better show the structural arrangement of the thin film transistor in the drawings of the present disclosure, the size and relative proportion of the thin film transistor and the photosensitive device in each of the sensor units are not drawn in accordance with the actual size ratio.

The above-described embodiments are merely illustrative of the principles and construction of the present disclosure, and are not intended to limit the present disclosure, and those skilled in the art will understand that any modification and improvements to the present disclosure may be made within the scope of this disclosure without departing from the general inventive concept. The protection scope of the disclosure should be determined by the scope defined by the claims of the present application.

The invention claimed is:

1. A fingerprint identification sensor comprising:
    a substrate; and
    a plurality of sensor units on the substrate, each of the sensor units comprising a thin film transistor and a photosensitive device;
    wherein the thin film transistor comprises a source and a drain, an active layer and a gate, the source and the drain being arranged substantially in a direction perpendicular to the substrate surface,
    wherein at least a portion of the active layer is located between the source and drain in the direction perpendicular to the substrate surface,
    wherein in a direction parallel to the substrate surface, the gate is located on a side of the source and the drain away from the photosensitive device, and the thin film transistor further comprises a gate insulation layer between the gate and the active layer,
    wherein one of the source and the drain is disposed directly on the substrate surface and is directly connected to the active layer, and
    wherein the other of the source and drain is disposed on the gate insulation layer and is connected to the active layer through a first via hole in the gate insulation layer in the direction perpendicular to the substrate surface.

2. The fingerprint identification sensor according to claim 1, wherein:
    within each of the sensor units, in a direction parallel to the substrate surface, the thin film transistor is located on a first side of a substrate surface and the photosensitive device is located on a second side of the substrate surface opposite to the first side, and
    the photosensitive device, the source and drain, the active layer, and the gate are disposed on the substrate surface sequentially from the second side to the first side.

3. The fingerprint identification sensor according to claim 1, wherein a black resin layer is disposed between the source and the drain, and the active layer covers at least a portion of the black resin layer.

4. The fingerprint identification sensor according to claim 1, wherein the photosensitive device comprises a first electrode, a photosensitive layer, and a second electrode disposed in the direction perpendicular to a substrate surface, and wherein the first electrode is closer to the substrate surface than the second electrode, one of the source and the drain is integrated with the first electrode.

5. The fingerprint identification sensor according to claim 2, wherein the photosensitive device comprises a first electrode, a photosensitive layer, and a second electrode disposed in the direction perpendicular to a substrate surface, and wherein the first electrode is closer to the substrate surface than the second electrode, one of the source and the drain is integrated with the first electrode.

6. The fingerprint identification sensor according to claim 3, wherein the photosensitive device comprises a first electrode, a photosensitive layer, and a second electrode disposed in the direction perpendicular to a substrate surface, and wherein the first electrode is closer to the substrate surface than the second electrode, one of the source and the drain is integrated with the first electrode.

7. The fingerprint identification sensor according to claim 4, wherein the gate insulation layer of the thin film transistor covers at least an upper portion of the photosensitive layer and the second electrode is connected to the photosensitive layer through a second via hole in the gate insulation layer.

8. The fingerprint identification sensor according to claim 1, wherein the photosensitive device is a PIN photodiode or a heterojunction photodiode.

9. A method for manufacturing a fingerprint identification sensor according to claim 1, the method comprising the steps of:
   a) depositing a metal layer on the substrate surface and integrally forming one of the source and the drain of the thin film transistor as well as the first electrode of the photosensitive device through one and the same patterning process;
   b) preparing a photosensitive layer of the photosensitive device and forming an active layer of the thin film transistor; and
   c) depositing a metal layer and performing a patterning process to the metal layer to form a second electrode of the photosensitive device, a gate of the thin film transistor, and the other of the source and the drain, respectively, wherein the other of the source and the drain is connected to the active layer though a first via hole in the gate insulation layer, and the second electrode is connected to the photosensitive layer of the photosensitive device through a second via hole of the gate insulation layer.

10. The method according to claim 9, further comprising a step between step a) and step b):
   applying a black resin material and performing a patterning process to the black resin material to form a black resin layer.

11. The method according to claim 9, further comprising a step between step b) and step c):
   depositing an insulation layer and performing a patterning process to the insulation layer to form a gate insulation layer.

12. The method according to claim 9 wherein the photosensitive device is a PIN photodiode, and wherein the step b) comprises: preparing an N-terminal, a P-terminal, and an intrinsic portion between the N-terminal and the P-terminal of the PIN photodiode, and forming the active layer of the thin film transistor at the same time of forming one of the N-terminal, the P-terminal, and the intrinsic portion of the PIN photodiode.

13. The method according to claim 9 wherein the photosensitive device is a heterojunction photodiode, and wherein the step b) comprises: preparing an N-terminal and a P-terminal of the heterojunction photodiode, and forming the active layer of the thin film transistor at the same time of forming the N-terminal of the heterojunction photodiode.

14. A fingerprint identification apparatus comprising the fingerprint identification sensor according to claim 1.

* * * * *

UNITED STATES PATENT AND TRADEMARK OFFICE
CERTIFICATE OF CORRECTION

PATENT NO. : 10,726,237 B2
APPLICATION NO. : 16/104604
DATED : July 28, 2020
INVENTOR(S) : Zhiwei Liang et al.

Page 1 of 1

It is certified that error appears in the above-identified patent and that said Letters Patent is hereby corrected as shown below:

In the Specification

Column 12, Line 50:
Delete "5701"
Insert --S701--

Signed and Sealed this
First Day of September, 2020

Andrei Iancu
*Director of the United States Patent and Trademark Office*